United States Patent
Würfel et al.

(10) Patent No.: US 9,281,252 B1
(45) Date of Patent: Mar. 8, 2016

(54) METHOD COMPRISING APPLYING AN EXTERNAL MECHANICAL STRESS TO A SEMICONDUCTOR STRUCTURE AND SEMICONDUCTOR PROCESSING TOOL

(71) Applicant: GLOBALFOUNDRIES Inc., Grand Cayman (KY)

(72) Inventors: Alexander Würfel, Dresden (DE); Moritz Andreas Meyer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/523,217

(22) Filed: Oct. 24, 2014

(51) Int. Cl.
| | |
|---|---|
| *H01L 21/76* | (2006.01) |
| *H01L 21/66* | (2006.01) |
| *H01L 21/02* | (2006.01) |
| *H01L 21/67* | (2006.01) |
| *H01L 21/687* | (2006.01) |
| *C23C 16/52* | (2006.01) |
| *C23C 16/50* | (2006.01) |

(52) U.S. Cl.
CPC ............. *H01L 22/20* (2013.01); *C23C 16/50* (2013.01); *C23C 16/52* (2013.01); *H01L 21/02274* (2013.01); *H01L 21/67092* (2013.01); *H01L 21/67288* (2013.01); *H01L 21/687* (2013.01); *H01L 22/12* (2013.01)

(58) Field of Classification Search
CPC ............ H01L 21/687; H01L 21/38707; H01L 21/38714; H01L 21/68728
USPC .................................................. 438/758–794
See application file for complete search history.

(56) References Cited

U.S. PATENT DOCUMENTS

2006/0276977 A1* 12/2006 Rosakis et al. ................. 702/42
2007/0049020 A1* 3/2007 Huang et al. .................. 438/680

* cited by examiner

*Primary Examiner* — Karen Kusumakar
(74) *Attorney, Agent, or Firm* — Amerson Law Firm, PLLC

(57) ABSTRACT

A method includes providing a semiconductor structure. An external mechanical stress is applied to the semiconductor structure. One or more semiconductor manufacturing processes are performed while the external mechanical stress is applied to the semiconductor structure. The one or more semiconductor manufacturing processes provide one or more material layers having an intrinsic stress at the semiconductor structure. After performing the one or more semiconductor manufacturing processes, the external mechanical stress is removed from the semiconductor structure. The removal of the external mechanical stress at least partially relaxes the intrinsic stress of the one or more material layers.

24 Claims, 8 Drawing Sheets

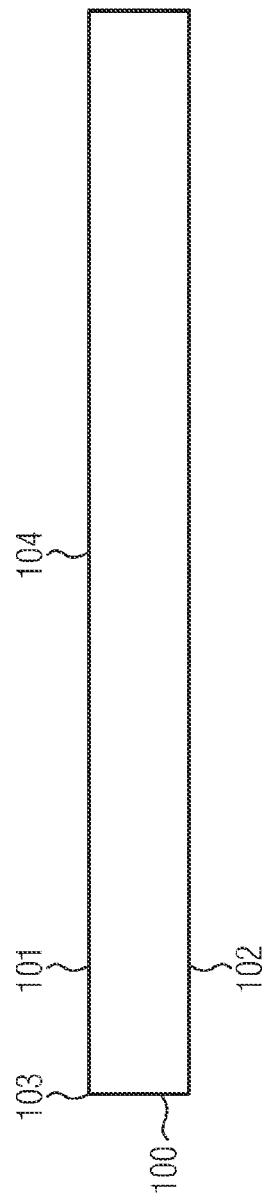
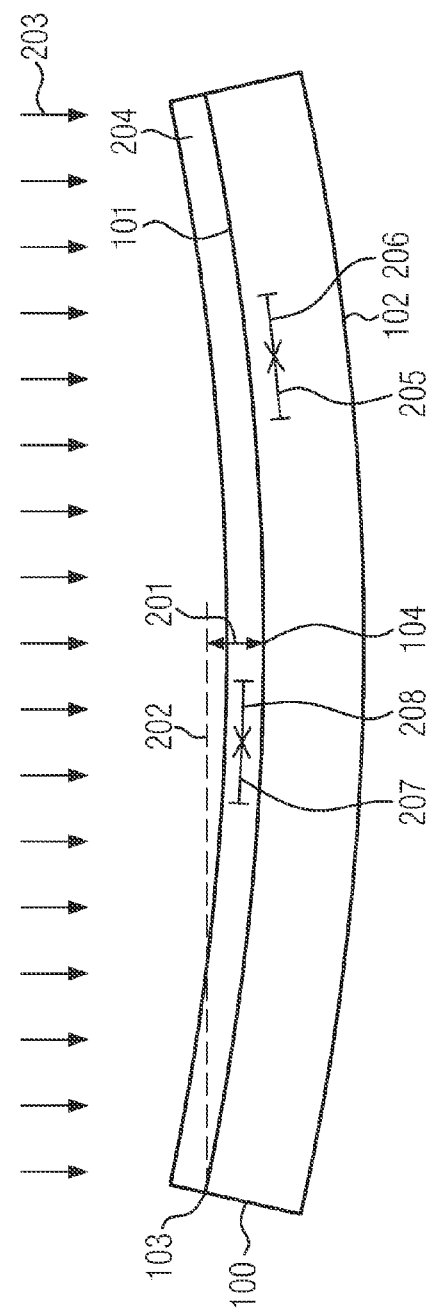
FIG. 1
FIG. 2

US 9,281,252 B1

METHOD COMPRISING APPLYING AN EXTERNAL MECHANICAL STRESS TO A SEMICONDUCTOR STRUCTURE AND SEMICONDUCTOR PROCESSING TOOL

BACKGROUND OF THE INVENTION

1. Field of the Invention

Generally, the present disclosure relates to the field of integrated circuits, and, in particular, to methods of forming integrated circuits wherein material layers having an intrinsic stress are deposited and to semiconductor processing tools that are employed in such methods.

2. Description of the Related Art

Integrated circuits include a number of individual circuit elements such as, for example, transistors, capacitors, diodes and resistors, which are interconnected by means of electrically conductive metal lines formed in an interlayer dielectric. The electrically conductive metal lines may be provided in a plurality of interconnect layers that are stacked on top of each other above a substrate. Metal lines in different interconnect layers may be electrically connected with each other by means of contact vias that are filled with metal. In and on the substrate, field effect transistors and, optionally, other circuit elements, such as capacitors, diodes and resistors, may be formed. Contact holes filled with an electrically conductive metal may be used for connecting the circuit elements with electrically conductive metal lines.

The electrically conductive metal lines may be formed in a back-end-of-line phase of semiconductor manufacturing. For forming the electrically conductive metal lines, damascene techniques may be employed. In damascene techniques, trenches and contact vias are formed in an interlayer dielectric, which may include silicon dioxide, a low-k material having a smaller dielectric constant than silicon dioxide, for example, a dielectric constant smaller than about 3.9 and/or an ultra-low-k material, which may have a dielectric constant smaller than about 2.4. In the trenches and contact vias, a diffusion barrier layer may be formed. After the formation of the diffusion barrier layer, the trenches and contact vias may be filled with a metal such as copper or a copper alloy. This may be done by means of electroplating for depositing the metal and chemical mechanical polishing for removing portions of the metal deposited outside the trenches and contact vias.

In the deposition of interlayer dielectrics over a semiconductor structure, a formation of an intrinsic stress in the deposited material may occur. In semiconductor structures wherein the interlayer dielectric includes a relatively soft material, which may be the case, in particular, when the interlayer dielectric includes an ultra-low-k material, an intrinsic stress of the interlayer dielectric may increase the risk of a formation of cracks in the interlayer dielectric. Cracks may be formed during the manufacturing of a semiconductor structure and/or during the operational life of the semiconductor structure, leading to yield loss or reliability failures. The formation of cracks may be driven by an adhesion between interconnect layers, an overall stress state of the stack of interconnect layers and/or local stress gradients.

In view of the situation described above, the present disclosure provides methods and semiconductor processing tools which may help to substantially avoid or at least reduce the occurrence of issues as described above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure. An external mechanical stress is applied to the semiconductor structure. One or more semiconductor manufacturing processes are performed while the external mechanical stress is applied to the semiconductor structure. The one or more semiconductor manufacturing processes provide one or more material layers having an intrinsic stress at the semiconductor structure. After performing the one or more semiconductor manufacturing processes, the external mechanical stress is removed from the semiconductor structure. The removal of the external mechanical stress at least partially relaxes the intrinsic stress of the one or more material layers.

An illustrative semiconductor processing tool disclosed herein includes a processing chamber that is operable to perform one or more semiconductor manufacturing processes in the processing chamber. Additionally, the semiconductor processing tool includes a chucking system. The chucking system is provided in the processing chamber. It receives a semiconductor structure and bends the semiconductor structure while the one or more semiconductor manufacturing processes are performed, wherein a surface of the semiconductor structure opposite the chucking system obtains one of a concave and a convex shape.

BRIEF DESCRIPTION OF THE DRAWINGS

The disclosure may be understood by reference to the following description taken in conjunction with the accompanying drawings, in which like reference numerals identify like elements, and in which:

FIGS. 1-3 show schematic cross-sectional views of a semiconductor structure in stages of a method according to an embodiment;

Figure 3:
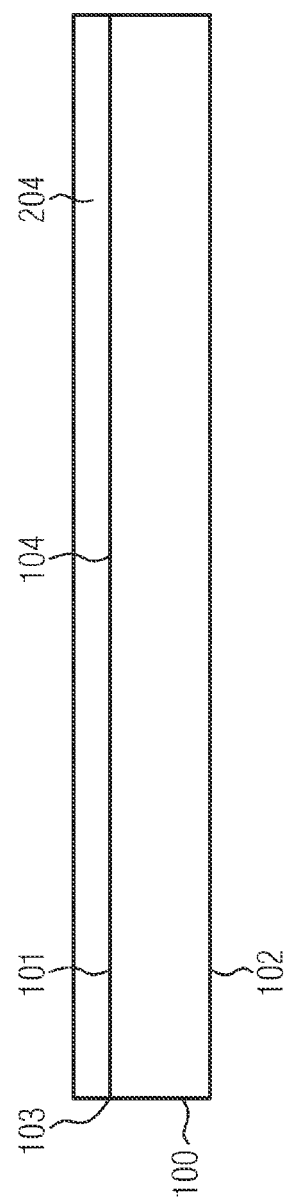

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In embodiments disclosed herein, the buildup of an intrinsic stress in the interconnect layer stack during a deposition and/or treatment of individual layers, such as, for example, layers of interlayer dielectrics, which may include an ultra-low-k dielectric, may be controlled by pre-stressing a semiconductor structure, such as, for example, a wafer, mechanically. Pre-stressing the semiconductor structure may allow a compensation for or at least a reduction of stresses introduced during processing.

In embodiments disclosed herein, a global mechanical stress may be introduced into the semiconductor structure in a process chamber of a semiconductor processing tool during relevant process steps. The introduction of stress may be achieved by a system for chucking and/or clamping a semiconductor structure that is provided in the processing chamber. In particular, a defined bow (positive or negative) may be applied to the semiconductor structure. In some embodiments, the bow of the semiconductor structure may be measured during operation, and it may be dynamically adjusted if needed.

In some embodiments, a chucking system which may, in particular, include a wafer chuck, may be designed to change its shape, while the semiconductor structure, which may include a semiconductor wafer, stays in contact with the wafer chuck across its entire surface. The shape of the wafer chuck may be adjustable from convex to concave during operation. This may be realized, for example, by piezoelectric drives that move radial zone segments. These drives can change the shape of an elastic member such as, for example, a membrane that holds the wafer itself. The mechanism for changing the shape of the wafer chuck may be completely encased inside the body of the wafer chuck together with potential heating/cooling capabilities. Furthermore, the wafer chuck may be configured for applying a bias potential to the semiconductor structure.

In other embodiments, the wafer chuck need not be designed to change its shape. Instead, it may be configured to allow for zonal chucking/dechucking during processing. In some embodiments, this may be realized by implementing rings of electrostatic chucking zones that can be controlled independently. The semiconductor structure may be grabbed at the wafer edge by grippers, mechanical clamps or similar devices which can apply a mechanical force for bending the semiconductor structure. The independent chucking zones can hold parts of the wafer. As a result, the wafer can be bent.

Applying an external mechanical stress to the semiconductor structure provides an additional parameter in the semiconductor processing tool, at least during some manufacturing steps, for the control of layer properties, which may be employed for optimization, in addition to optimizations based on parameters like precursors, temperatures, pressures, plasma energies or anneal parameters.

FIG. 1 shows a schematic cross-sectional view of a semiconductor structure 100 in a stage of a method according to an embodiment. The semiconductor structure 100 has a front side surface 101 and a back side surface 102. The semiconductor structure 100 may have an approximately circular cylindrical shape, wherein the front side surface 101 and the backside surface 102 form end surfaces of the cylinder. The front side surface 101 has a center 104 and an edge 103. In embodiments wherein the semiconductor structure 100 has an approximately circular cylindrical shape, the edge 103 may have an approximately circular shape. A radius of the edge 103 of the semiconductor structure 100 is typically substantially greater than a thickness of the semiconductor structure 100, being a distance between the front side surface 101 and the back side surface 102, so that the semiconductor structure 100 has a disk shape.

In some embodiments, the semiconductor structure 100 may include a semiconductor substrate being a bulk semiconductor wafer, for example, a silicon wafer. In other embodiments, the semiconductor structure 100 may include a semiconductor substrate being a semiconductor-on-insulator (SOI) wafer that includes a layer of a semiconductor material, such as, for example, silicon, that is provided on a layer of an electrically insulating material, such as, for example, silicon dioxide. The layer of electrically insulating material may be provided on a support substrate, which may be a silicon wafer.

In some embodiments, one or more flats or notches may be provided at the edge 103 of the semiconductor structure 100, the position of which may be representative of a crystal orientation of the semiconductor material of the semiconductor substrate. The term "approximately circular" used above for describing the shape of the edge 103 of the semiconductor structure 100 is to be understood as including embodiments wherein the semiconductor structure 100 has flats or notches which provide a deviation of the shape of the edge 103 from an exactly circular shape.

Dimensions of the semiconductor substrate of the semiconductor structure 100 may correspond to those of semiconductor wafers employed in conventional semiconductor manufacturing processes.

In addition to the semiconductor substrate, the semiconductor structure 100 may include circuit elements such as, for example, transistors, diodes, resistors and/or capacitors, which are formed in and on the semiconductor substrate at the front side surface 101 of the semiconductor structure 100.

Additionally, the semiconductor structure 100 may include one or more interconnect layers which are formed at the front side surface 101 of the semiconductor structure 100 over the circuit elements. The interconnect layers may include an interlayer dielectric and electrically conductive metal features that may include trenches and contact vias which are filled with an electrically conductive metal, such as copper or a copper alloy. In some embodiments, the interlayer dielectric may include a low-k dielectric material having a dielectric constant smaller than a dielectric constant of silicon dioxide, for example, a dielectric constant of less than about 3.9, or an ultra-low-k dielectric having a dielectric constant of less than about 2.4. Examples of ultra-low-k interlayer dielectrics that may be provided in the semiconductor structure 100 may include OMCTS2.7, being a porous SiCOH material that is obtainable by performing a chemical vapor deposition (CVD) process or plasma enhanced chemical vapor deposition (PECVD) process, wherein OMCTS (octomethylcyclotetrasiloxane) is used as a precursor.

At the stage of the method illustrated in FIG. 1, the front side surface 101 and the back side surface 102 of the semiconductor structure 100 may be substantially flat, wherein the center 104 of the semiconductor structure 100 and the edge 103 lie in substantially the same plane.

The semiconductor structure 100 as illustrated in FIG. 1 may be formed using conventional techniques for the manufacturing of semiconductor structures, which may include front-end-of-line processes for forming circuit elements such as transistors, diodes, resistors and/or capacitors, and, optionally, back-end-of-line processes for forming interconnect layers, including an interlayer dielectric and electrically conductive metal features. In some embodiments, for providing interlayer dielectrics that may be present in the semiconductor structure 100 at the stage of the method shown in FIG. 1, techniques as described in the following with reference to FIGS. 2 and 3 may be employed.

FIG. 2 shows a schematic cross-sectional view of the semiconductor structure 100 in a later stage of the manufacturing process. The semiconductor structure 100 may be bent. Techniques that may be employed for bending the semiconductor structure 100 will be described in more detail below. When the semiconductor structure 100 is bent, the front side surface 101 and also the back side surface 102 of the semiconductor structure 100 obtain a shape that is different from the substantially flat shape of the front side surface 101 and the back side surface 102 in the stage of the method illustrated in FIG. 1.

In some embodiments, the front side surface 101 of the semiconductor structure 100 may obtain a concave shape when the semiconductor structure 100 is bent, as illustrated in FIG. 2. When the front side surface 101 obtains a concave shape, the center 104 of the semiconductor structure 100 is located at a distance 201 from a plane 202 through the edge 103 of the semiconductor structure 100. When the front side surface 101 obtains a concave shape, the back side surface 102 may obtain a convex shape so that the semiconductor structure 100 as a whole obtains a "bowl" shape.

In some embodiments, the semiconductor structure may be bent such that the front side surface 101 and/or the back side surface 102 obtain a substantially spherical shape, which approximately corresponds to a section of the surface of a sphere wherein substantially the entire front side surface 101 has substantially the same curvature, and/or substantially the entire back side surface 102 has substantially the same curvature.

When the semiconductor structure 100 is bent, a mechanical stress may be created in the semiconductor structure 100, which, in the following, will be denoted as "external mechanical stress," for distinguishing the stress obtained by bending the semiconductor structure 100 from a so-called "intrinsic stress," which may be present in material layers formed on the semiconductor structure 100, and which is not caused by an external force applied to the semiconductor structure 100.

When the semiconductor structure 100 is bent such that the front side surface 101 obtains a concave shape and the back side surface 102 obtains a convex shape, as illustrated in FIG. 2, at least portions of the semiconductor structure 100 adjacent the front side surface 101 may be compressed so that a compressive external mechanical stress is obtained adjacent the front side surface 101. In FIG. 2, the compressive external stress obtained adjacent the front side surface 101 is schematically illustrated by arrows 205, 206, which point towards each other.

When the semiconductor structure 100 is in a bent configuration, a deposition process may be performed, as schematically illustrated by arrows 203 in FIG. 2. The deposition process 203 may deposit a material layer 204 over the front side surface 101 of the semiconductor structure 100.

In some embodiments, the deposition process 203 may include a chemical vapor deposition process or a plasma enhanced chemical vapor deposition process, and it may be performed in a processing chamber of a semiconductor processing tool according to an embodiment that will be described below.

In embodiments wherein the deposition process 203 includes a chemical vapor deposition process, one or more gaseous precursors may be supplied to the front side surface 101 of the semiconductor structure 100. At the front side surface 101, chemical reactions of the one or more gaseous precursors may occur, wherein a material of the material layer 204 is formed. In embodiments wherein the deposition process 203 is a plasma enhanced chemical vapor deposition process, the gaseous precursors that are supplied to the front side surface 101 of the semiconductor 100 may be ionized by means of an electric discharge, for example, a radio frequency electric discharge. Additionally, a bias voltage may be applied to the semiconductor structure 100.

Features of the deposition process 203, such as reactant gas flows, reactant gas pressure, temperature and, in embodiments wherein the deposition process 203 is a plasma enhanced chemical vapor deposition process, plasma energy and bias voltage applied to the semiconductor structure 100, may correspond to those which are conventionally employed in chemical vapor deposition processes or plasma enhanced chemical vapor deposition processes, respectively, for depositing the material of the material layer 204. In some embodiments, the material layer 204 may include an ultra-low-k interlayer dielectric material such as, for example, OMCTS2.7.

During the deposition of the material layer 204, an intrinsic stress may be formed in the material layer 204. The intrinsic stress may be a compressive stress, as schematically illustrated by arrows 207, 208 pointing towards each other in FIG. 2. Due to the intrinsic stress 207, 208, distances between atoms in the material layer 204 may deviate from the natural spacing between atoms of the material of the material layer 204. The intrinsic stress 207, 208 may be caused by features of the deposition process 203 and/or an interaction between the material of the material layer 204 and the material that is present at the front side surface 101 of the semiconductor structure 100 below the material layer 204.

During the deposition process 203, the semiconductor structure 100 may be maintained in the bent configuration, so that the external mechanical stress 205, 206 is present during the deposition process 203.

In some embodiments, a curvature of the front side surface 101 of the semiconductor structure 100 may be measured during the deposition process 203, and the bending of the semiconductor structure 100 may be adjusted such that the curvature of the front side surface 101 of the semiconductor structure 100 is maintained approximately at a target curvature. This may help to maintain a substantially constant strength of the external mechanical stress 205, 206 in the semiconductor structure 100. Techniques for measuring the curvature of the front side surface 101 and for adjusting the bending of the semiconductor structure 100 will be detailed below.

The deposition process 203 need not be a chemical vapor deposition process or a plasma enhanced chemical vapor deposition process. Physical vapor deposition, atomic layer deposition or molecular beam epitaxy may also be employed.

FIG. 3 shows a schematic cross-sectional view of the semiconductor structure 100 in a later stage of the method. After the deposition process 203, the bending of the semiconductor structure 100 may be stopped, so that the external mechanical stress is removed from the semiconductor structure 100. Thus, the front side surface 101 and the back side surface 102 can obtain a substantially flat shape again. When the shape of the front side surface 101 changes from the concave shape as illustrated in FIG. 2 to the substantially flat shape as illustrated in FIG. 3, the material layer 204 that was deposited over the front side surface 101 may be expanded to a certain extent. The expansion of the material layer 204 may lead to a relaxation of the intrinsic stress that was created in the material layer 204 during the deposition process 203, in particular in embodiments wherein the material layer 204 has a compressive intrinsic stress 207, 208. Thus, compared to depositing the material layer 204 on the semiconductor structure 100 without applying the external mechanical stress, a smaller intrinsic stress of the material layer 204 or a substantially unstressed material layer 204 may be obtained. This may help to reduce the likelihood of a formation of cracks in the material layer 204.

The present disclosure is not limited to embodiments wherein only deposition process 203 is performed while the semiconductor structure 100 is bent. In some embodiments, other semiconductor manufacturing processes may additionally be performed such as, for example, an annealing process. In further embodiments, the deposition process 203 may be omitted, and one or more manufacturing processes other than deposition processes that can lead to a formation of an intrinsic stress in one or more material layers that are already present in the semiconductor structure 100 may be performed while the semiconductor structure 100 is bent.

Furthermore, as will be detailed in the following with reference to FIGS. 4 and 5, the present disclosure is not limited to embodiments wherein the semiconductor structure 100 is bent such that a concave shape of the front side surface 101 is obtained.

Figure 4:
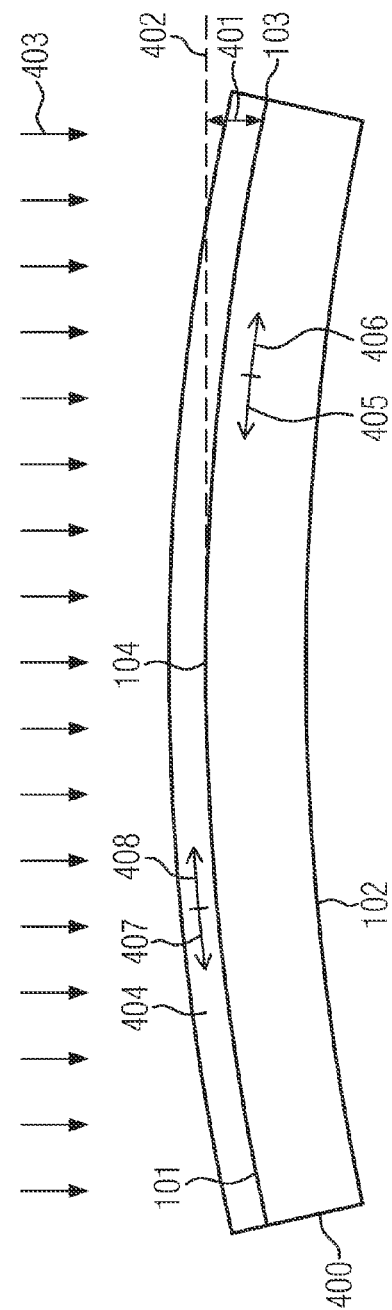
FIGS. 4-5 show schematic cross-sectional views of a semiconductor structure in stages of a method according to an embodiment.

FIG. 4 shows a schematic cross-sectional view of a semiconductor structure 400 in a stage of a method according to an embodiment. Features of the semiconductor structure 400 may generally correspond to features of the semiconductor structure 100. For convenience, corresponding features have been denoted by like reference numerals, and a detailed description thereof will be omitted for simplicity. In particular, the semiconductor structure 400 may have a front side surface 101 having a center 104 and an edge 103 and a back side surface 102, wherein circuit elements of an integrated circuit and, optionally, one or more interconnect layers may be provided at the front side surface 101.

The semiconductor structure 400 may be bent to a "dome" shape, so that the front side surface 101 of the semiconductor structure 400 obtains a convex shape and the backside surface 102 obtains a concave shape. Thus, the edge 103 of the front side surface 101 is arranged at a distance 401 to a plane 402 that runs through the center 104 of the front side surface 101 and is parallel to the edge 103 of the front side surface 101. The bending of the semiconductor structure 400 may provide an external mechanical stress in the semiconductor structure 400, wherein the external mechanical stress may be tensile, at least in portions of the semiconductor structure 400 adjacent the front side surface 101, as schematically illustrated by arrows 405, 406 pointing away from each other.

A deposition process 403 may be performed while the semiconductor structure 400 is bent. In the deposition process 403, a material layer 404 may be deposited over the semiconductor structure 400.

Similar to the deposition process 203 described above with reference to FIG. 2, the deposition process 403 may be a chemical vapor deposition process or a plasma enhanced chemical vapor deposition process. Atomic layer deposition, physical vapor deposition or molecular beam epitaxy may also be used. Moreover, similar to the material layer 204, the material layer 404 may include an interlayer dielectric material such as, for example, an ultra-low-k dielectric. However, different from the material layer 204 described above, the material layer 404 may obtain an intrinsic tensile stress during the deposition process 403 or another manufacturing process, as schematically illustrated by arrows 407, 408 pointing away from each other in FIG. 4. Whether an intrinsic compressive stress or an intrinsic tensile stress is obtained in a manufacturing process can depend on parameters of the process. In the case of a chemical vapor deposition process, the parameters may include, for example, type and flow rate of gaseous precursors employed, temperature, pressure and, in embodiments wherein the deposition process 403 is a plasma-enhanced chemical vapor deposition process, plasma energy and/or bias voltage.

Figure 5:
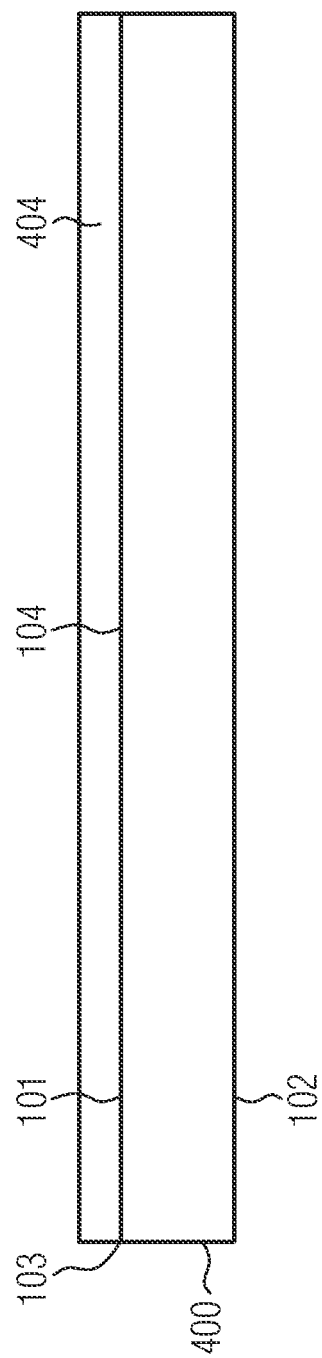

FIG. 5 shows a schematic cross-sectional view of the semiconductor structure 400 in a later stage of the method. After the deposition process 403 and/or other semiconductor manufacturing processes that may be performed in addition to the deposition process 403 or alternatively to the deposition process 403, the bending of the semiconductor structure 400 may be stopped, so that the external mechanical stress 405, 406 is removed from the semiconductor structure 400, and the front side surface 101 and the back side surface 102 obtain a substantially flat shape again. When the front side surface 101 obtains a substantially flat shape, the material layer 404 that was deposited on the convexly curved front side surface 101 in the deposition process 403 may be compressed to a certain extent, which may substantially remove or at least reduce the tensile stress 407, 408.

Figure 6:
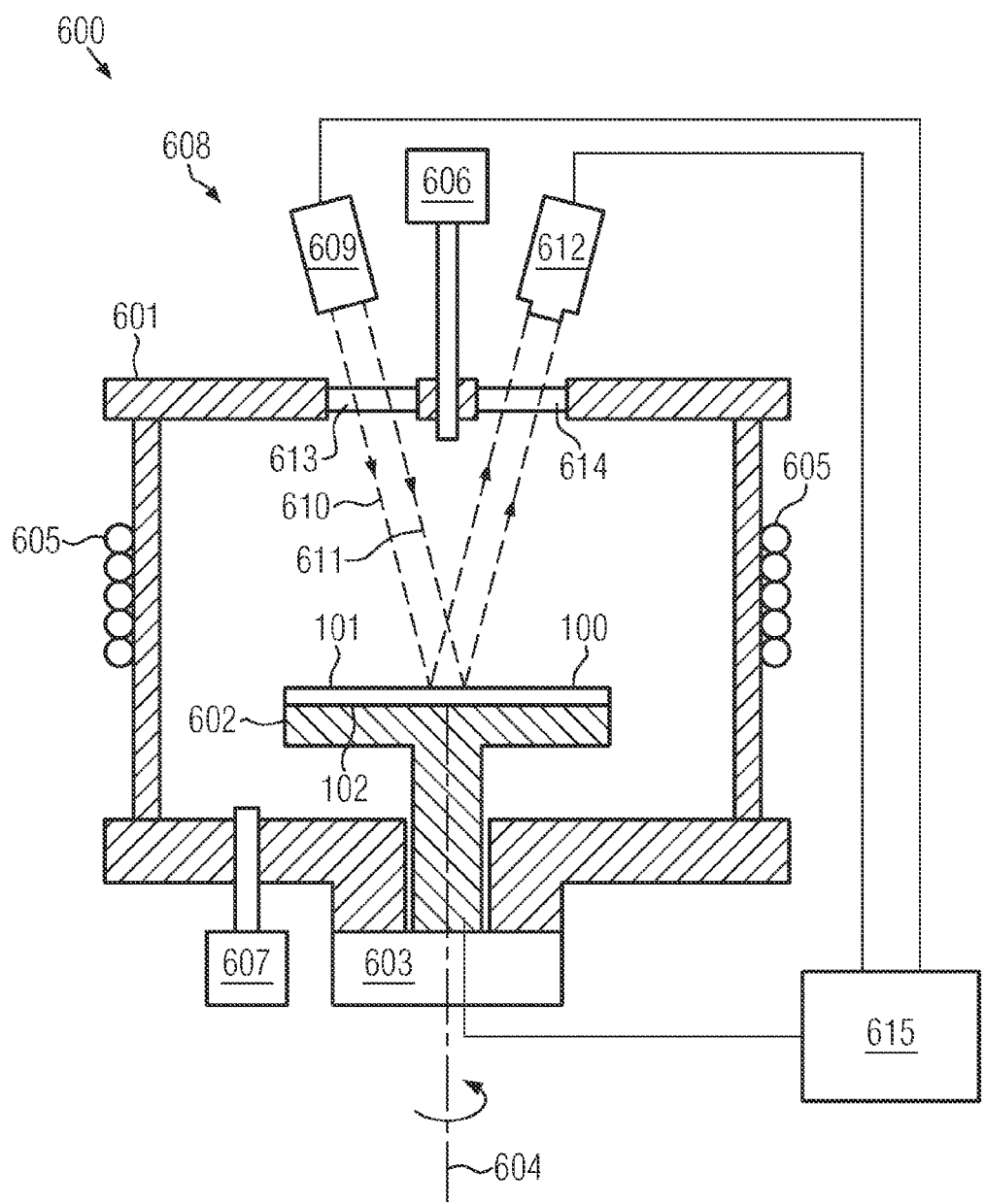
FIG. 6 shows a schematic cross-sectional view of a semiconductor processing tool according to an embodiment.

FIG. 6 shows a schematic cross-sectional view of a semiconductor processing tool 600 according to an embodiment that may be used for performing the methods described above with reference to FIGS. 1 to 5.

The semiconductor processing tool 600 includes a processing chamber 601. The processing chamber 601 may be configured for performing one or more semiconductor manufacturing processes in the processing chamber 601. In particular, in some embodiments, the processing chamber 601 may be configured for performing a chemical vapor deposition process and/or a plasma enhanced chemical vapor deposition process. For this purpose, a gas supply 606 for supplying a reactant gas that includes gaseous precursors of a material to be deposited on a semiconductor structure, for example the semiconductor structure 100 described above with references to FIGS. 1-3, or alternatively, semiconductor structure 400 as described above with reference to FIGS. 4-5, may be provided. Additionally, a vacuum pump 607 may be provided for removing gasses from the processing chamber 601. In embodiments wherein the semiconductor processing tool 600 is configured for performing a plasma enhanced chemical vapor deposition process, one or more radio frequency coils 605 for creating a radio frequency discharge in a reactant gas in the processing chamber 601 may also be provided. Further features of the processing chamber 601, the gas supply 606, the vacuum pump 607 and the radio frequency coils 605 may correspond to features of conventional tools for performing chemical vapor deposition processes and/or plasma enhanced chemical vapor deposition processes.

The present disclosure is not limited to embodiments wherein the processing chamber 601 is only configured for performing chemical vapor deposition processes and/or plasma enhanced chemical deposition processes. In some embodiments, the processing chamber 601 may be configured for performing other semiconductor manufacturing processes, such as, for example, annealing processes instead of, or in addition to, chemical vapor deposition processes and/or plasma enhanced chemical vapor deposition processes. In further embodiments, the processing chamber 601 may be configured for performing deposition processes other than chemical vapor deposition and/or plasma enhanced chemical vapor deposition, such as, for example, atomic layer deposition and/or physical vapor deposition.

The semiconductor processing tool 600 may further include a chucking system 602 that is provided in the processing chamber 601. The chucking system 602 is configured for receiving a semiconductor structure, wherein, as an example of a semiconductor structure, the semiconductor structure 100 described above with reference to FIGS. 1-3 is shown in FIG. 6. When the chucking system 602 receives the semiconductor structure 100, the back side surface 102 of the semiconductor structure 100 may be provided on the chucking system 602, whereas the front side surface 601 is at a side of the semiconductor structure 100 opposite the chucking system 602, so that gasses and/or plasmas in the processing chamber 601 can reach the front side surface 101 of the semiconductor structure 100. In some embodiments, the semiconductor processing tool 600 may include a motor 603 for rotating the chucking system 602 around an axis of rotation 604 during a semiconductor manufacturing process that is performed in the processing chamber 601.

As will be described in more detail below, the chucking system may be configured for bending the semiconductor structure 100 or another semiconductor structure, for example the semiconductor structure 400 described above with reference to FIGS. 4-5, while one or more semiconductor manufacturing processes are performed. Thus, the front side surface 101 of the semiconductor structure, which is arranged opposite the chucking system 602, may obtain a concave shape, as described above with reference to FIG. 2, or a convex shape, as described above with reference to FIG. 4.

The semiconductor processing tool 600 may further include a measurement system 608 that is configured for measuring a curvature of the front side surface 101 of the semiconductor structure 100. In some embodiments, the measurement system 608 may include a light source 609 that is configured for emitting a first light beam 610 and a second light beam 611. The light beams 610, 611 may be laser beams, and they may be substantially parallel to each other. The light beams 610, 611 may impinge on the front side surface 101 of the semiconductor structure 100 provided on the chucking system 602, and may be reflected from the front side surface 101. If the front side surface 101 is substantially flat, the substantially parallel light beams 610, 611 emitted by the light source 609 remain substantially parallel to each other when they are reflected from the front side surface 101. If the front side surface 101 is concave, the light beams 610, 611 become convergent when they are reflected at the front side surface 101. If the front side surface 101 is convex, the light beams 610, 611 become divergent when they are reflected from the front side surface 101.

The measurement system 608 may further include a light detector 612 that may be used for determining a curvature of the front side surface 101 of the semiconductor structure 100 from the reflected light beams 610, 611. In some embodiments, the light detector 612 may include a CCD or CMOS sensor connected to a computer for performing image processing, and the curvature of the front side surface 101 of the semiconductor structure 100 may be determined from positions on the sensor on which the reflected light beams 610, 611 impinge. If the front side surface 101 has a concave shape, a distance between points on the light detector 612 on which the reflected light beams 610, 611 impinge may be smaller than the original distance of the light beams 610, 611 as emitted by the light source 609, wherein the distance decreases with an increasing concave curvature of the front side surface 101. If the front side surface 101 has a convex shape, a distance between points on the light detector 612 at which the reflected light beams 610, 611 impinge may be greater than the original distance between the light beams 610, 611 as emitted by the light source 609, wherein a greater distance corresponds to a greater convex curvature of the front side surface 101.

For determining the distance between the points on the light detector at which the reflected light beams 610, 611 impinge, and for determining the curvature of the front side surface 101 of the semiconductor structure 100, known techniques of image processing may be employed.

The present disclosure is not limited to embodiments wherein two light beams 610, 611 are emitted by the light source 609 and received by the light detector 612. In other embodiments, a greater number of light beams may be used. In further embodiments, the light source 609 may emit a single relatively wide collimated light beam, and the light detector 612 may be configured to determine if the reflected light beam is convergent or divergent.

The processing chamber 601 may include windows 613, 614. The one or more light beams emitted by the light source 609 may enter the processing chamber 601 through the window 613, and the reflected light beams may leave the processing chamber 601 through the window 614. Thus, the light source 609 and the light detector 612 may be provided outside the processing chamber 601.

The present disclosure is not limited to embodiments wherein the processing chamber 601 includes two windows 613, 614. In other embodiments, a single window may be provided, wherein the one or more light beams emitted by the light source 609 may enter the processing chamber 601 and leave the processing chamber 601 after reflection at the front side surface 101 of the semiconductor structure 100 through the same window.

The semiconductor processing tool 600 may further include a control system 615. The control system 615 may be connected to the measurement system 608. It can control the measurement system 608 for determining the curvature of the front side surface 101 of the semiconductor structure 100, and it can receive a measured value of the curvature of the front side surface 101 of the semiconductor structure 100. Furthermore, the control system 615 may be connected to the chucking system 602. The control system 615 may control the chucking system 602 for adjusting the curvature of the front side surface 101 of the semiconductor structure 100 in response to the value of the curvature measured by the measurement system 608. Thus, the curvature of the front side surface 101 of the semiconductor structure 100 may be controlled so that it substantially corresponds to a desired target value of the curvature and/or so that only a relatively small value of a difference between the measured value of the curvature of the front side surface 101 and the target curvature is obtained.

Figure 7:
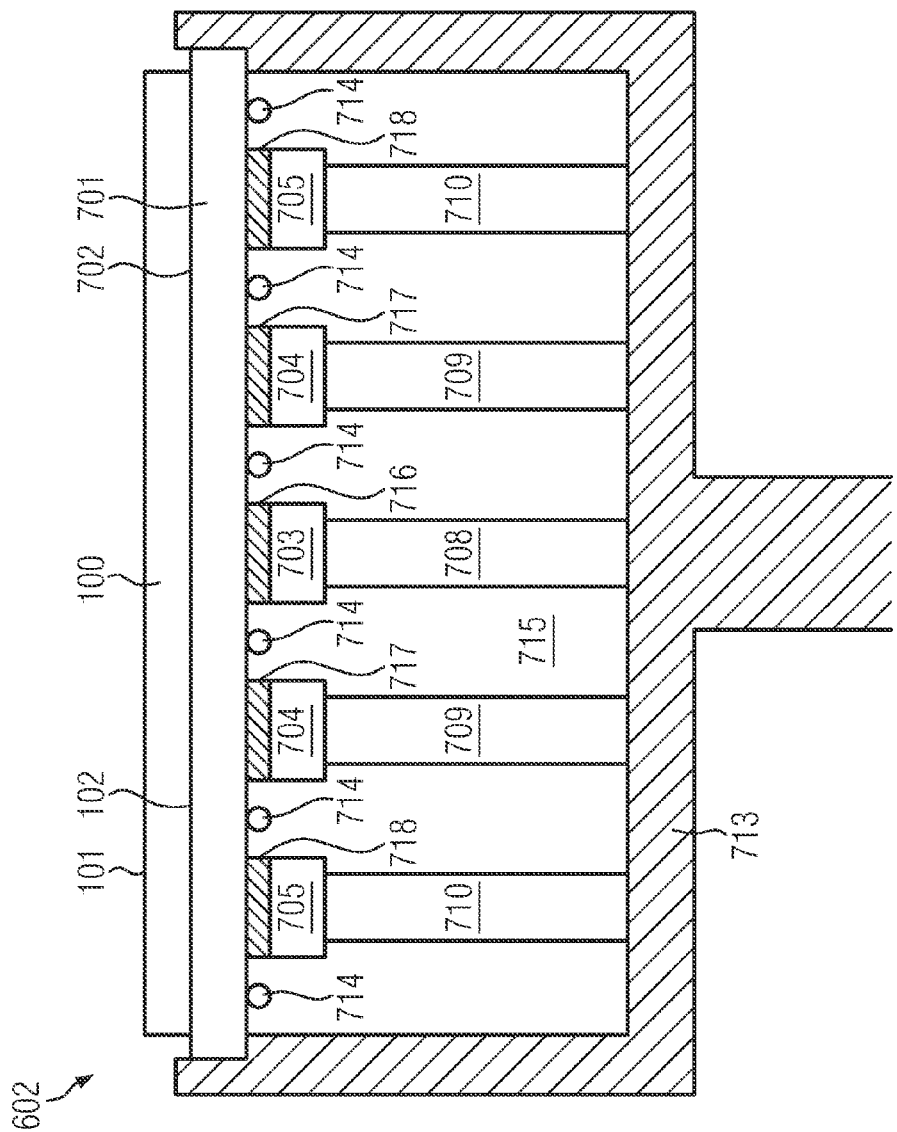
FIGS. 7-9 show schematic cross-sectional views of a chucking system of a semiconductor processing tool according to an embodiment.

FIG. 7 shows a schematic cross-sectional view of the chucking system 602 that may be provided in the processing chamber 601 of the semiconductor processing tool 600. The chucking system 602 may include a body 713 and an elastic member 701. The elastic member 701 and the body 713 may enclose an inner volume 715 of the chucking system 602. In some embodiments, the elastic member 701 and the body 713 may be connected to each other so that the inner volume 715 is substantially sealed from an environment of the chucking system 602. Thus, an entry of reactive gasses that may be present in the processing chamber 601 during a semiconductor manufacturing process, such as a chemical vapor deposition process or a plasma enhanced chemical vapor deposition process, into the inner volume 715 may be substantially avoided or at least reduced.

A surface of the elastic member 701 opposite the inner volume 715 of the chucking system 602 may provide a semiconductor support surface 702 of the chucking system 602. In the processing of a semiconductor structure in the semiconductor processing tool 600, a semiconductor structure may be provided on the semiconductor support surface 702. As an example, FIG. 7 shows the semiconductor structure 100 described above with reference to FIGS. 1-3, wherein the back side surface 102 of the semiconductor structure 100 contacts the semiconductor support surface 702 and the front side surface 101 on which the material layer 204 is deposited is arranged on a side of the semiconductor structure 100 opposite the chucking system 602.

The elastic member 701 may be formed of an electrically insulating material that provides a sufficient degree of elasticity for assuming a shape that corresponds to the shape of the backside surface 102 of the semiconductor structure 100 when the semiconductor structure 100 is bent for applying an external mechanical stress 205, 206 to the semiconductor structure 100.

In some embodiments, the elastic member 701 may include a membrane formed from a polymer, a ceramic material, a glass, a glass ceramic material and/or a metal.

At a side of the elastic member 701 opposite the semiconductor support surface 702, a plurality of electrodes 716, 717, 718 may be provided. The electrode 716 at the center of the semiconductor support surface 702 may have an approximately circular shape, and the electrodes 717, 718 may have a ring shape. In the operation of the chucking system 602, voltages may be applied to the electrodes 716, 717, 718 for holding the semiconductor structure 100 at the semiconductor support surface 702 of the elastic member 701 by means of electrostatic forces. The application of voltages to the electrodes 716, 717, 718 may be performed in accordance with known techniques for the use of electrostatic semiconductor wafer chucks.

Additionally, the electrodes 716, 717, 718 may be employed for applying a bias voltage to the semiconductor structure 100 during a semiconductor manufacturing process, in particular during a plasma enhanced chemical deposition process, that is performed in the processing chamber 601 of the semiconductor processing tool 600.

The present disclosure is not limited to embodiments wherein the electrodes 716, 717, 718 are arranged at a side of the elastic member 701 opposite the semiconductor support surface 702. In other embodiments, electrodes may be arranged in the elastic member 701. For example, the elastic member 701 may include an upper and a lower membrane of an elastic material, and electrodes similar to the electrodes 716, 717, 718 may be arranged between the upper and the lower membrane.

The chucking system 602 may further include a plurality of radial zone segments 703, 704, 705. The radial zone segment 703 at the center of the semiconductor support surface 702 may have an approximately circular shape and the radial zone segments 704, 705 may have a ring shape.

Furthermore, the chucking system 602 may include a plurality of actuators 708, 709, 710. The actuator 708 is associated with the radial zone segment 703 and configured for moving the radial zone segment 703 in an axial direction of the chucking system 602 (vertical in the view of FIG. 7). The actuator 709 is associated with the radial zone segment 704 and adapted for moving the radial zone segment 704 in the axial direction of the chucking system 602. The actuator 710 is associated with the radial zone segment 705 and adapted for moving the radial zone segment 705 in the axial direction.

The actuators 708, 709, 710 may be controlled independently of each other, so that positions of the radial zone segments 703, 704, 705 in the axial direction may be changed relative to each other by operating the actuators 708, 709, 710. Thus, a shape of the semiconductor support surface 702 of the chucking system 602 may be adjusted. In some embodiments, each of the actuators 708, 709, 710 may include one or more piezoelectric drives.

The chucking system 602 may further include a temperature control system 714. The temperature control system 714 may be configured for controlling a temperature of the elastic member 701 and the semiconductor structure 100 provided on the elastic member 701. In some embodiments, the temperature control system 714 may include one or more heating elements for heating the semiconductor structure 100. Additionally, or alternatively, the temperature control system 714 may include one or more cooling coils which may, for example, be provided in the form of tubes through which a liquid coolant may be flown for cooling a semiconductor structure 100.

The electrodes 716, 717, 718, the radial zone segments 703, 704, 705, the actuators 708, 709, 710 and the temperature control system 714 may be provided in the inner volume 715 of the chucking system 602 that is enclosed by the body 713 and the elastic member 701, so that these components of the chucking system 602 can be protected from the environment in the processing chamber 601.

The actuators 708, 709, 710 may be connected to the control system 615. Thus, the control system 615 can control the shape of the semiconductor support surface 702.

Figure 8:
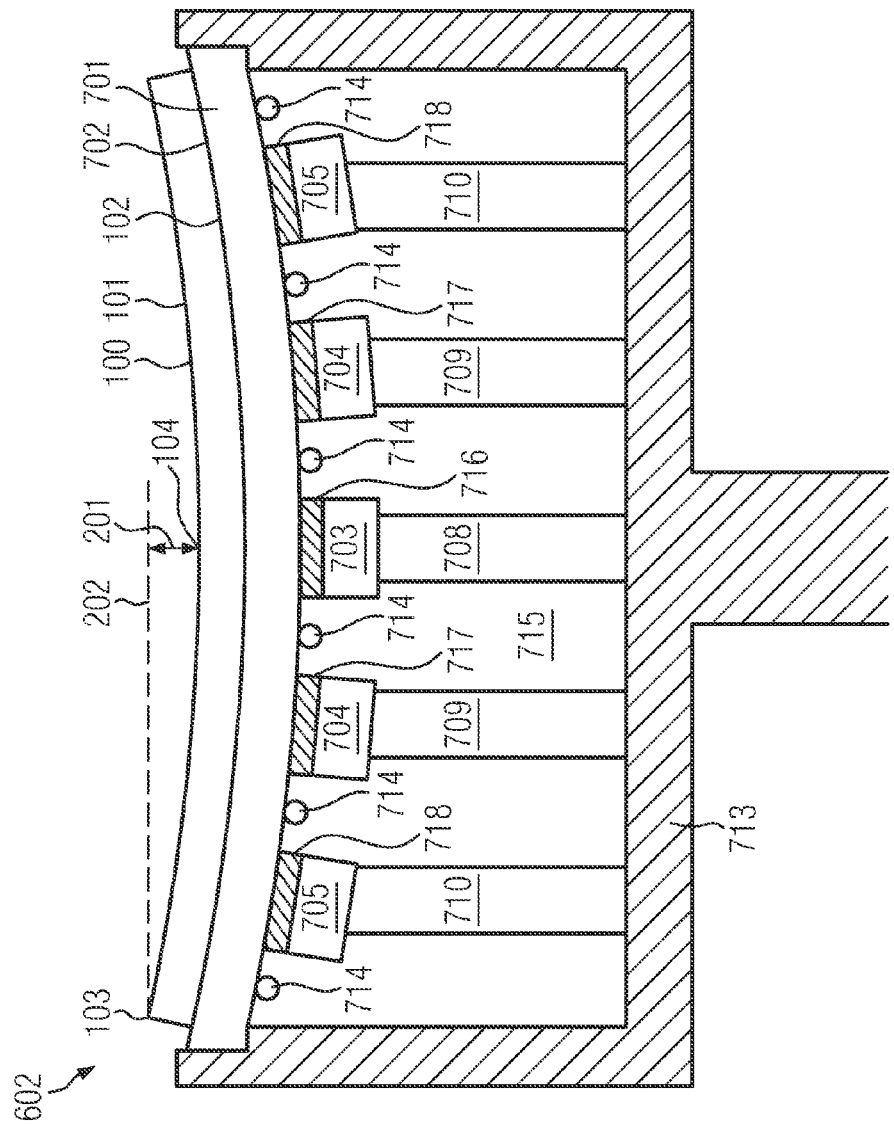

FIG. 8 shows a schematic cross-sectional view of the chucking system 602 when the chucking system 602 is used for bending the semiconductor structure 100 such that a concave shape of the front side surface 101 of the semiconductor structure 100 is obtained.

By applying suitable voltages to the electrodes 716, 717, 718, an attractive force between the elastic member 701 and the semiconductor structure 100 provided thereon may be obtained so that the shape of the semiconductor structure 100 adapts to the shape of the semiconductor structure support surface 702. Additionally, the actuators 708, 709, 710 may be operated for providing a concave shape of the semiconductor structure support surface 702. In particular, the actuators 708, 709, 710 may be operated such that the radial zone segments 703, 704, 705 are moved downwards. In embodiments wherein the actuators 708, 709, 710 include piezoelectric drives, this may be done by applying a respective voltage to a piezoelectric material in each of the piezoelectric drives that is adapted such that a length of the actuators 708, 709, 710 along the axial direction of the chucking system 602 is reduced.

The radial zone segment 703 may be moved downwards to a greater extent than the radial zone segment 704, and the radial zone segment 704 may be moved downwards to a greater extent than the radial zone segment 705. Thus, a relatively smooth curvature of the semiconductor support surface 702, for example an approximately spherical curvature, may be obtained.

The shape of the back side surface 102 and, accordingly, also the shape of the front side surface 101 of the semiconductor structure 100 may adapt to the shape of the semiconductor structure support surface 702, so that a concave shape of the front side surface 101 of the semiconductor structure 100 is obtained, wherein the center 104 of the front side surface 101 is arranged at a distance 201 to a plane 202 through the edge 103 of the front side surface 101, as described above with reference to FIG. 2.

The control system 615 may operate the actuators 708, 709, 710 in response to measurement values of the curvature of the front side surface 101 of the semiconductor structure 100 received from the measurement system 608 for bringing the concave curvature of the front side surface 101 close to a target curvature.

Figure 9:
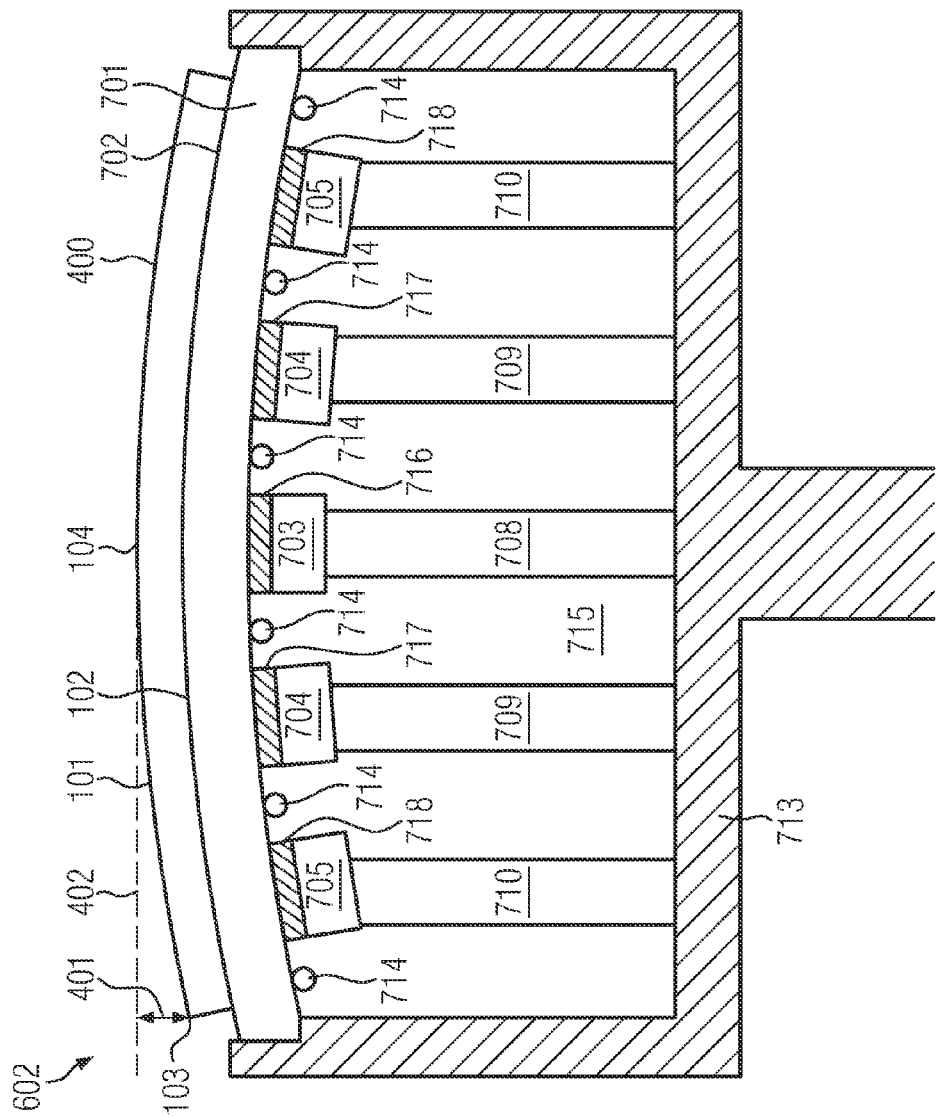

FIG. 9 shows a schematic cross-sectional view of the chucking system 602 when the semiconductor structure 400 described above with reference to FIGS. 4 and 5 is provided on the semiconductor structure support surface 702, and the chucking system 602 is used for bending the semiconductor structure 400 so that the front side surface 101 of the semiconductor structure 400 contains a convex shape.

The actuators 708, 709, 710 of the chucking system 602 may be operated so that the radial zone segments 703, 704, 705 are moved upward along the axial direction of the chucking system 602. The radial zone segment 703 may be moved upward by a greater distance than the radial zone segment 704, and the radial zone segment 704 may be moved upward by a greater distance than the radial zone segment 705. Thus, a relatively smooth convex curvature of the semiconductor structure surface 702, for example a substantially spherical curvature of the semiconductor support surface 702, may be obtained.

In embodiments wherein the actuators 708, 709, 710 include piezoelectric drives, voltages may be applied to the piezoelectric drives that are adapted such that the extension of the actuators 708, 709, 710 along the axial direction of the chucking system 602 increases.

Voltages may be applied to the electrodes 716, 717, 718 of the chucking system 602 for attracting the semiconductor structure 400 to the elastic member 701. Thus, the semiconductor structure 400 can adapt to the convex shape of the semiconductor structure support surface 702 so that a convex shape of the front side surface 101 of the semiconductor structure 400 is obtained wherein the edge 103 of the front side surface 101 is at a distance 401 to a plane 402 that runs through the center 104 of the front side surface 101 and is parallel to the edge 103.

The control system may operate the actuators 708, 709, 710 in accordance with a measurement value of the curvature of the front side surface 101 of the semiconductor structure 400 received from the measurement system 608 for bringing the convex curvature of the front side surface 101 close to a target curvature.

Figure 10:
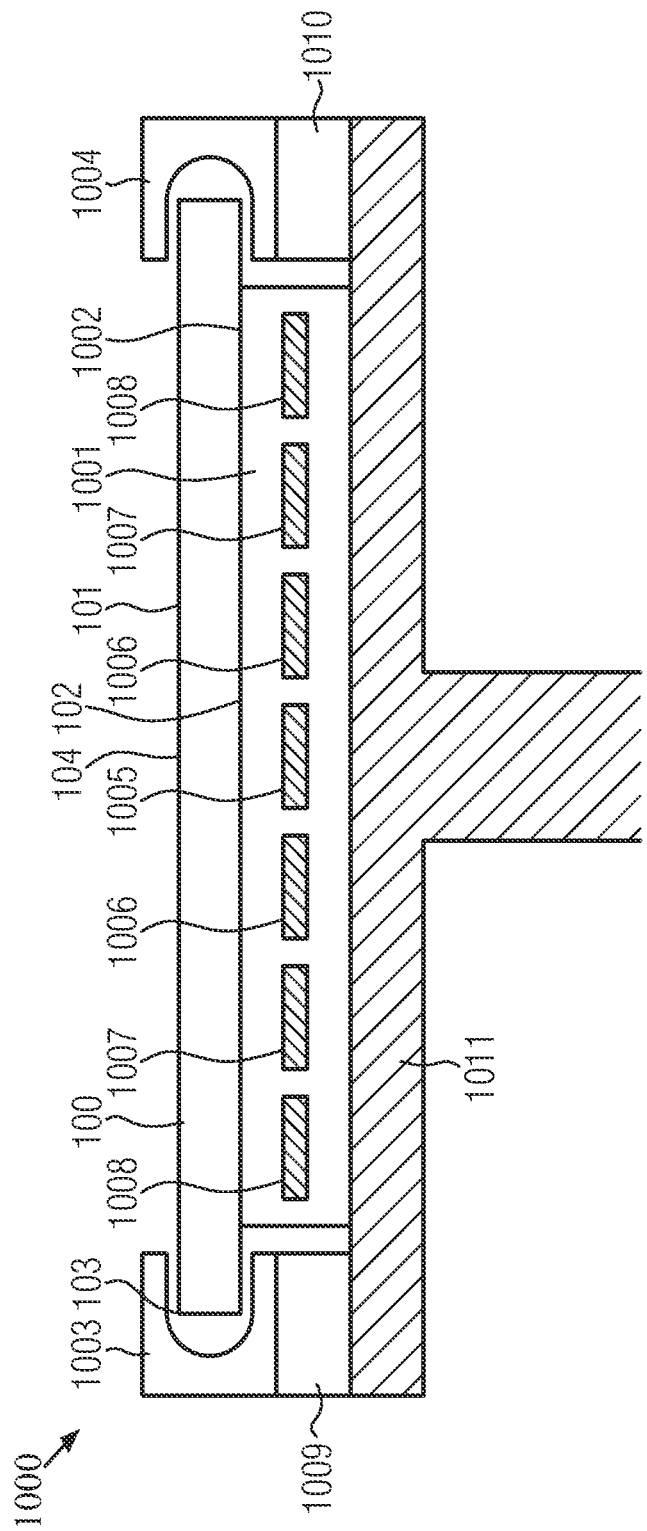
FIG. 10 shows a schematic cross-sectional view of a chucking system of a semiconductor processing tool according to an embodiment.

FIG. 10 shows a schematic cross-sectional view of a chucking system 1000 that may be provided in the processing chamber 601 of the semiconductor processing tool 600 as an alternative to the chucking system 602 described above.

The chucking system 1000 includes a semiconductor structure support member 1001 that may be provided on a body 1011 of the chucking system 1000. The semiconductor structure support member 1001 may have a semiconductor structure support surface 1002. The semiconductor structure support surface 1002 may be substantially flat. Dimensions and/or materials of the semiconductor structure support member 1001 and/or the body 1011 may be adapted such that the semiconductor structure support surface 1002 is substantially rigid and remains substantially flat in the operation of the chucking system 1000.

In the semiconductor structure support member 1001, electrodes 1005, 1006, 1007, 1008 can be provided. Alternatively, the electrodes 1005, 1006, 1007, 1008 may be provided below the semiconductor structure support member 1002. Among the electrodes 1005, 1006, 1007, 1008, the central electrode 1005 may have a circular shape, and the electrodes 1006, 1007, 1008 may have a ring shape.

A semiconductor structure, for example the semiconductor structure 100 described above with reference to FIGS. 1-3, as shown in FIG. 10 or, alternatively, the semiconductor structure 400 described above with reference to FIGS. 4 and 5, may be provided on the semiconductor structure support surface 1002 so that the back side surface 102 of the semiconductor structure 100 contacts the semiconductor structure support surface 1002, and the front side surface 101 is arranged opposite the chucking system 1000. Thus, the front side surface 101 of the semiconductor structure 100 is exposed.

The chucking system 1000 may further include a plurality of grippers 1003, 1004 and a plurality of actuators 1009, 1010.

The grippers 1003, 1004 may be adapted for gripping the edge 103 of the semiconductor structure 100 provided on the semiconductor structure support surface 1002. In addition to the two grippers 1003, 1004 shown in the cross-sectional view in FIG. 10, the chucking system 1000 may include a number of further grippers, which may be arranged around the edge 103 of the semiconductor structure 100 provided on the semiconductor structure support surface 1002. Alternatively, the chucking system 1000 may include a single substantially circularly shaped gripper that may engage substantially the entire edge 103 of the semiconductor structure 100, and the chucking system 1000 may include a single actuator associated with the single gripper.

The actuators 1009, 1010 may be adapted for moving the grippers 1003, 1004 in the axial direction of the chucking system 1000 (vertical in the view of FIG. 10). Similarly, in embodiments wherein a single gripper is provided instead of the grippers 1003, 1004, the actuator associated with the gripper may be adapted for moving the gripper in the axial direction.

In addition to the axial movement of the grippers 1003, 1004 provided by the actuators 1009, 1010, the grippers 1003, 1004 may be moveable in a radial direction of the chucking system 1000 (horizontal in the view of FIG. 10) for allowing an insertion of the semiconductor structure 100 into the grippers 1003, 1004 and a removal of the semiconductor structure 100.

The electrodes 1005, 1006, 1007, 1008 may be adapted for providing a zonal chucking and dechucking ability of the chucking system 1000. For example, a voltage of a first polarity, for example a positive voltage, may be applied to the electrode 1005, and a second voltage of the opposite polarity, for example a negative voltage, may be applied to the electrode 1006. The electrodes 1007, 1008 may be maintained at mass potential or at a bias voltage to be applied to the semiconductor structure 100 in the semiconductor manufacturing process. Thus, portions of the semiconductor structure 100 that are in the vicinity of the center 104 of the front side surface 101 may be held at the semiconductor structure support surface 1002. The actuators 1009, 1010 may be operated for moving the grippers 1003, 1004 in the upward direction. In doing so, portions of the semiconductor structure 100 in the vicinity of the edge 103 of the front side surface 101 may be moved away from the semiconductor structure support surface 1002, while the portions in the vicinity of the center 104 of the front side surface 101 are held at the semiconductor structure support surface 1002. Thus, the semiconductor structure 100 may be bent to a bowl shape, so that a concave shape of the front side surface 101 is obtained.

Alternatively, a voltage of a first polarity may be applied to the electrode 1007, and a voltage of a second polarity that is opposite to the first polarity may be applied to the electrode 1008, whereas the electrodes 1005, 1006 may be maintained at mass potential or at a bias voltage. Thus, portions of the semiconductor structure 100 in the vicinity of the edge 103 may be held at the semiconductor structure support surface 1002. The actuators 1009, 1010 may be operated for moving the grippers 1003, 1004 in the downward direction. Thus, the semiconductor structure 100 may be bent, so that portions of the semiconductor structure 100 in the vicinity of the center 104 of the front side surface 101 move away from the semiconductor structure support surface 1002, whereas the portions in the vicinity of the edge 103 are held at the semiconductor structure support surface 1002. Thus, the semiconductor structure 100 may be bent to a dome shape such that a convex shape of the front side surface 101 of the semiconductor structure 100 is obtained.

For controlling the curvature of the front side surface 101 of the semiconductor structure 100, the actuators 1009, 1010 may be operated by the control system 615.

Similar to the chucking system 602 described above with reference to FIGS. 7-9, the chucking system 1000 may include a temperature control system for heating and/or cooling the semiconductor structure 100 when the semiconductor structure 100 is provided on the semiconductor structure support surface 1002.

The present disclosure is not limited to embodiments wherein manufacturing processes for forming interlayer dielectrics having a low dielectric constant are performed while an external mechanical stress is applied to a semiconductor structure. In other embodiments, an external mechanical stress may be applied to a semiconductor structure while manufacturing processes, for example deposition processes, for forming interlayer dielectrics including silicon dioxide and/or silicon nitride are performed.

Moreover, the present disclosure is not limited to embodiments wherein interlayer dielectrics are formed. In further embodiments, an external mechanical stress may be applied to a semiconductor structure while manufacturing processes for forming materials other than interlayer dielectrics are performed, for example epitaxial growth processes for forming silicon germanium, or deposition processes for the formation of etch-stop layers, interlayer dielectric capping layers or metallic thin films.

Furthermore, in addition to the formation of integrated circuits, techniques as described herein may be used in the formation of micro electro-mechanical systems (MEMS).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention.

Accordingly, the protection sought herein is as set forth in the claims below.

What is claimed:

1. A method, comprising:
providing a semiconductor structure;
applying an external mechanical stress to said semiconductor structure by placing said semiconductor structure on a chucking system comprising one or more grippers for gripping an edge of said semiconductor structure and moving said one or more grippers to apply a mechanical force to the edge of said semiconductor structure while maintaining a contact between said semiconductor structure and a semiconductor support surface of said chucking system at only a portion of the semiconductor structure support surface to bend said semiconductor structure;
performing one or more semiconductor manufacturing processes while said semiconductor structure is on said chucking system and while said external mechanical stress is applied to said semiconductor structure, said one or more semiconductor manufacturing processes providing one or more material layers having an intrinsic stress at said semiconductor structure; and
after performing said one or more semiconductor manufacturing processes, removing said external mechanical stress from said semiconductor structure, the removal of said external mechanical stress at least partially relaxing said intrinsic stress of said one or more material layers.

2. The method of claim 1, wherein the application of said external mechanical stress comprises bending said semiconductor structure, wherein a surface of said semiconductor structure obtains one of a concave shape and a convex shape.

3. The method of claim 1, wherein said chucking system is maintained in a processing chamber of a semiconductor processing tool at least as long as said external mechanical stress is applied to said semiconductor structure.

4. The method of claim 3, further comprising performing one or more measurements of a curvature of said surface of said semiconductor structure and, after each of said one or more measurements of said curvature of said surface of said semiconductor structure, adjusting the bending of said semiconductor structure if a measured curvature deviates from a target curvature.

5. The method of claim 4, wherein at least one of said one or more measurements of said curvature of said surface of said semiconductor structure is performed during one of said one or more semiconductor manufacturing processes.

6. The method of claim 5, wherein said one or more semiconductor manufacturing processes comprise a deposition process wherein one of said one or more material layers is deposited on said surface of said semiconductor structure.

7. The method of claim 6, wherein said one of the one or more material layers comprises a layer of an interlayer dielectric.

8. The method of claim 7, wherein said interlayer dielectric comprises an ultra-low-k dielectric.

9. The method of claim 8, wherein said semiconductor structure is bent into a bowl shape, wherein said surface of said semiconductor structure obtains a concave shape.

10. The method of claim 8, wherein said semiconductor structure is bent into a dome shape, wherein said surface of said semiconductor structure obtains a convex shape.

11. A semiconductor processing tool, comprising:
a processing chamber operable to perform one or more semiconductor manufacturing processes in said processing chamber; and
a chucking system provided in said processing chamber, said chucking system comprising:
an elastic member, a surface of said elastic member providing a semiconductor structure support surface;
a plurality of radial zone segments supporting said elastic member; and
a plurality of actuators, wherein a subset of the actuators is associated with each of the radial zone segments, and the subsets are operable to move said plurality of radial zone segments to adjust a shape of said semiconductor structure support surface, wherein said chucking system is operable to receive a semiconductor structure and operate said plurality of actuators to bend said semiconductor structure while said one or more semiconductor manufacturing processes are performed, wherein a surface of said semiconductor structure opposite said chucking system obtains one of a concave and a convex shape.

12. The semiconductor processing tool of claim 11, further comprising a measurement system that measures a curvature of said surface of said semiconductor structure opposite said chucking system during at least one of said one or more semiconductor manufacturing processes.

13. The semiconductor processing tool of claim 12, further comprising a control system that receives a value of said curvature of said surface of said semiconductor structure opposite said chucking system measured by said measurement system and controls said chucking system in response thereto for reducing a difference between said measured value of said curvature of said surface of said semiconductor structure opposite said chucking system and a target curvature.

14. The semiconductor processing tool of claim 13, wherein said processing chamber is operable to perform a deposition process, said deposition process being one of said one or more semiconductor manufacturing processes.

15. The semiconductor processing tool of claim 14, wherein said processing chamber is operable to perform at least one of a plasma enhanced chemical vapor deposition process and a chemical vapor deposition process.

16. The semiconductor processing tool of claim 11, wherein
said plurality of actuators comprises a plurality of piezoelectric elements operable to move said plurality of radial zone segments.

17. The semiconductor processing tool of claim 16, wherein said chucking system further comprises a body and a temperature control system, said body and said elastic member forming an enclosure that encloses said plurality of actuators and said temperature control system.

18. A method, comprising:
providing a semiconductor structure;
placing said semiconductor structure on a chucking system comprising an elastic member, a surface of said elastic member providing a semiconductor structure support surface, a plurality of radial zone segments supporting said elastic member, and a plurality of actuators, wherein a subset of the plurality of actuators is associated with each of the plurality of radial zone segments, and the subsets are operable to move said plurality of radial zone segments to adjust a shape of said semiconductor structure support surface to apply an external mechanical stress to said semiconductor structure and bend said semiconductor structure;
performing one or more semiconductor manufacturing processes while said external mechanical stress is applied to said semiconductor structure, said one or more semiconductor manufacturing processes providing one or more material layers having an intrinsic stress at said semiconductor structure; and
after performing said one or more semiconductor manufacturing processes, removing said external mechanical stress from said semiconductor structure, the removal of said external mechanical stress at least partially relaxing said intrinsic stress of said one or more material layers.

19. The method of claim 18, wherein said plurality of actuators comprises a plurality of piezoelectric elements operable to move said plurality of radial zone segments.

20. The method of claim 18, wherein a surface of said semiconductor structure obtains a concave shape responsive to the application of said external mechanical stress.

21. A semiconductor processing tool, comprising:
a processing chamber operable to perform one or more semiconductor manufacturing processes in said processing chamber; and
a chucking system provided in said processing chamber, said chucking system receiving a semiconductor structure and bending said semiconductor structure while said one or more semiconductor manufacturing processes are performed, wherein a surface of said semiconductor structure opposite said chucking system obtains one of a concave and a convex shape, wherein said chucking system comprises a substantially rigid semiconductor support surface and one or more grippers for gripping an edge of said semiconductor structure and wherein said chucking system bends said semiconductor structure by moving said grippers for applying a mechanical force to said edge of said semiconductor structure while maintaining a contact between said semiconductor structure and said semiconductor structure support surface at only a portion of said semiconductor support surface.

22. The semiconductor processing tool of claim 21, further comprising a measurement system that measures a curvature of said surface of said semiconductor structure opposite said chucking system during at least one of said one or more semiconductor manufacturing processes.

23. The semiconductor processing tool of claim 22, further comprising a control system that receives a value of said curvature of said surface of said semiconductor structure opposite said chucking system measured by said measurement system and controls said chucking system in response thereto for reducing a difference between said measured value of said curvature of said surface of said semiconductor structure opposite said chucking system and a target curvature.

24. The semiconductor processing tool of claim 21, wherein a surface of said semiconductor structure obtains a concave shape responsive to the application of said external mechanical stress.

* * * * *